(12) United States Patent
Cho et al.

(10) Patent No.: US 11,594,472 B2
(45) Date of Patent: Feb. 28, 2023

(54) PACKAGE STRUCTURE AND METHOD OF FORMING THE SAME

(71) Applicant: Taiwan Semiconductor Manufacturing Company, Ltd., Hsinchu (TW)

(72) Inventors: Hung-Chun Cho, Hsinchu (TW); Hung-Jui Kuo, Hsinchu (TW); Yu-Hsiang Hu, Hsinchu (TW); Sih-Hao Liao, New Taipei (TW); Wei-Chih Chen, Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/687,688

(22) Filed: Mar. 7, 2022

(65) Prior Publication Data

US 2022/0189854 A1    Jun. 16, 2022

Related U.S. Application Data

(63) Continuation of application No. 16/547,590, filed on Aug. 22, 2019, now Pat. No. 11,270,927.

(51) Int. Cl.
*H01L 23/48* (2006.01)
*H01L 21/56* (2006.01)
*H01L 21/768* (2006.01)
*H01L 23/00* (2006.01)
*H01L 23/31* (2006.01)

(52) U.S. Cl.
CPC .......... *H01L 23/481* (2013.01); *H01L 21/565* (2013.01); *H01L 21/76871* (2013.01); *H01L 23/3107* (2013.01); *H01L 24/09* (2013.01); *H01L 24/32* (2013.01); *H01L 2224/02372* (2013.01); *H01L 2224/02379* (2013.01)

(58) Field of Classification Search
CPC combination set(s) only.
See application file for complete search history.

(56) References Cited

U.S. PATENT DOCUMENTS

2020/0357770 A1*  11/2020  Chiang ................... H01L 24/49

* cited by examiner

*Primary Examiner* — Moin M Rahman
*Assistant Examiner* — Mohammad A Rahman
(74) *Attorney, Agent, or Firm* — JCIPRNET

(57) ABSTRACT

A package structure and method of forming the same are provided. The package structure includes a die, a via, an encapsulant, an adhesion promoter layer, and a polymer layer. The via is laterally aside the die. The encapsulant laterally encapsulates the die and the via. The adhesion promoter layer is sandwiched between the via and the encapsulant. The encapsulant comprises a portion aside the via and under the adhesion promoter layer, and the portion of the encapsulant is sandwiched between the adhesion promoter layer and the polymer layer.

20 Claims, 15 Drawing Sheets

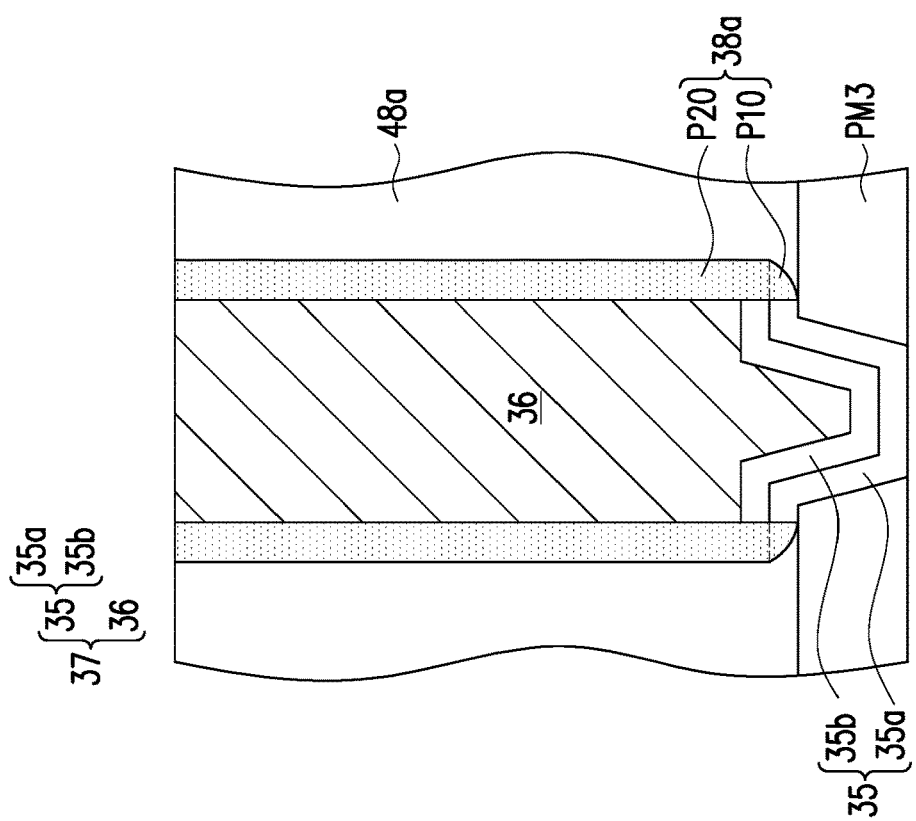
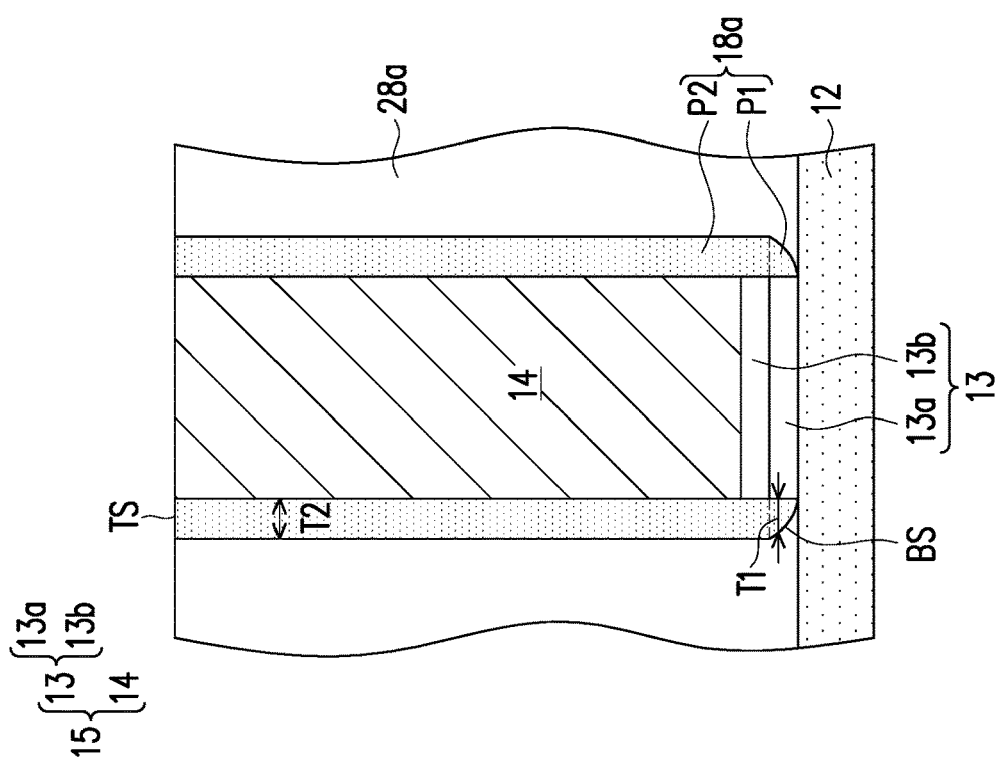

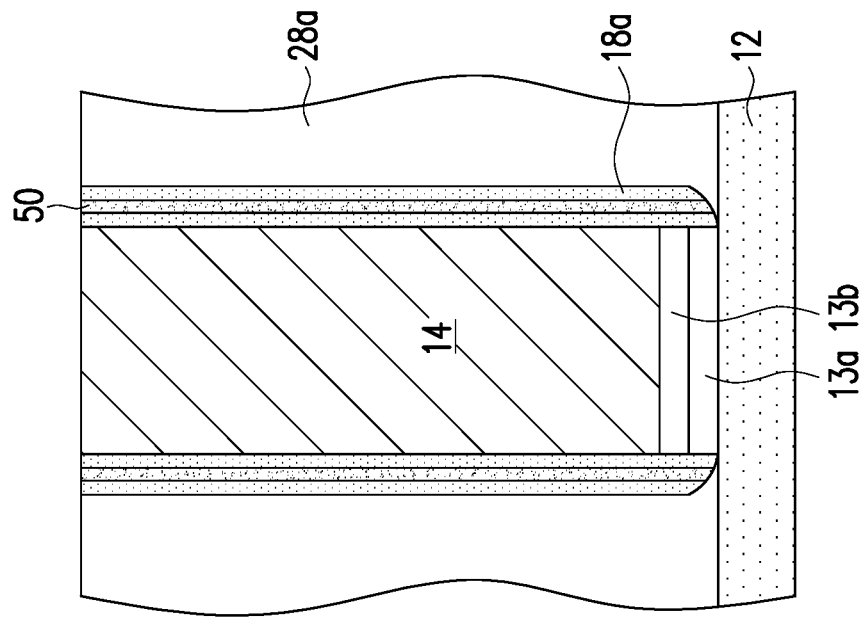
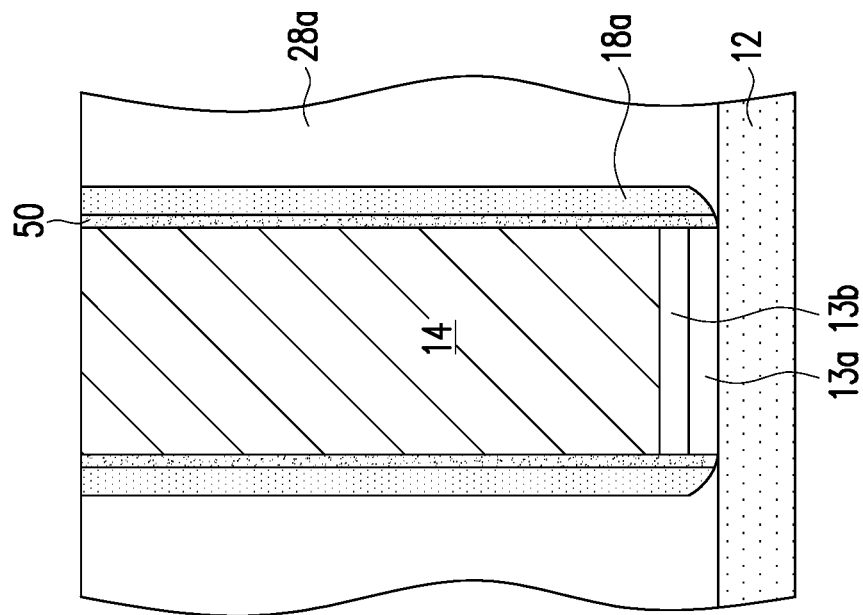
FIG. 3B
FIG. 3A

PACKAGE STRUCTURE AND METHOD OF FORMING THE SAME

CROSS-REFERENCE TO RELATED APPLICATION

This application is a continuation application of and claims the priority benefit of a prior application Ser. No. 16/547,590, filed on Aug. 22, 2019. The entirety of the above-mentioned patent application is hereby incorporated by reference herein and made a part of this specification.

BACKGROUND

The semiconductor industry has experienced rapid growth due to continuous improvements in the integration density of various electronic components (i.e., transistors, diodes, resistors, capacitors, etc.). For the most part, this improvement in integration density has come from continuous reductions in minimum feature size, which allows more of the smaller components to be integrated into a given area. These smaller electronic components also demand smaller packages that utilize less area than previous packages. Some smaller types of packages for semiconductor components include quad flat packages (QFPs), pin grid array (PGA) packages, ball grid array (BGA) packages, flip chips (FC), three-dimensional integrated circuits (3DICs), wafer level packages (WLPs), and package on package (PoP) devices and so on.

Currently, integrated fan-out packages are becoming increasingly popular for their compactness.

BRIEF DESCRIPTION OF THE DRAWINGS

FIG. 1A to FIG. 1M are schematic cross-sectional view illustrating a method of forming a package structure according to some embodiments of the disclosure.

FIG. 2A to FIG. 2C are enlarged cross-sectional views illustrating a portion of the package structure according to some embodiments of the disclosure.

FIG. 3A to FIG. 3C are enlarged cross-sectional views illustrating a portion of the package structure according to some embodiments of the disclosure.

DETAILED DESCRIPTION

Figure 1A:
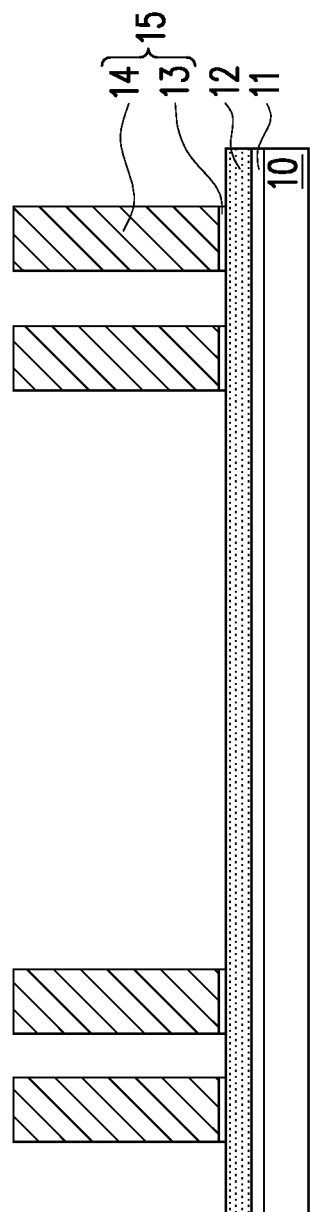

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "above", "upper" and the like, may be used herein for ease of description to describe one element or feature's relationship to another element(s) or feature(s) as illustrated in the FIGS. The spatially relative terms are intended to encompass different orientations of the device in use or operation in addition to the orientation depicted in the FIG.s. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A to FIG. 1M are schematic cross-sectional views illustrating a method of forming a package structure and a PoP device according to some embodiments of the disclosure. FIG. 2A to FIG. 2C are enlarged cross-sectional views illustrating a polymer layer, a TIV, an adhesion promoter layer and an encapsulant of a package structure.

Figure 2C:
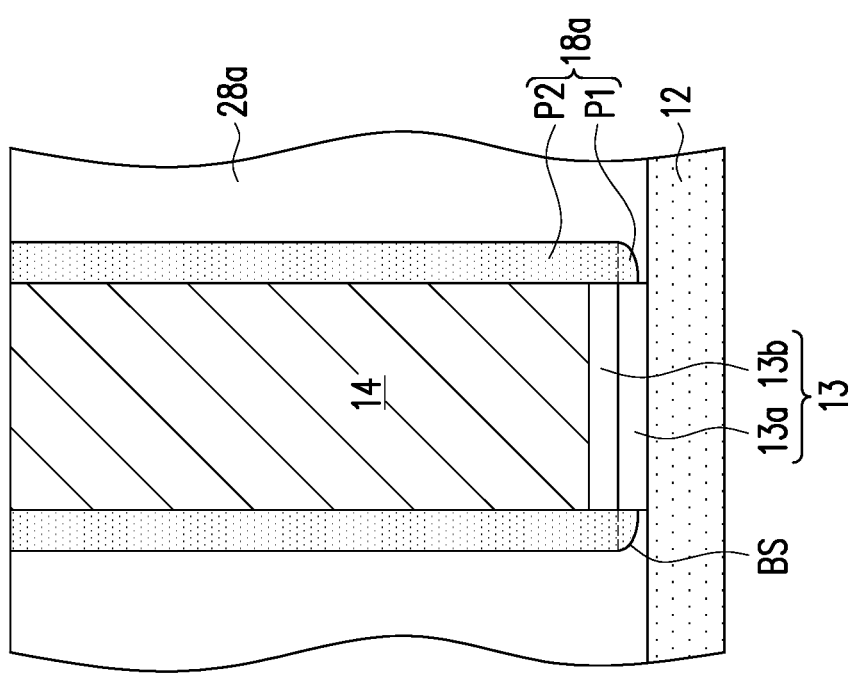

Referring to FIG. 1A, a carrier 10 is provided. The carrier 10 may be a glass carrier, a ceramic carrier, or the like. A de-bonding layer 11 is formed on the carrier 10 by, for example, a spin coating method. In some embodiments, the de-bonding layer 11 may be formed of an adhesive such as an Ultra-Violet (UV) glue, a Light-to-Heat Conversion (LTHC) glue, or the like, or other types of adhesives. The de-bonding layer 11 is decomposable under the heat of light to thereby release the carrier 10 from the overlying structures that will be formed in subsequent steps.

A polymer layer 12 is formed on the de-bonding layer 11. The polymer layer 12 includes, for example, polyimide (PI), polybenzoxazole (PBO), benzocyclobutene (BCB), Ajinomoto Buildup Film (ABF), or the like or combinations thereof. The polymer layer 12 is formed by a suitable fabrication technique such as spin-coating, lamination, deposition, or the like.

Still referring to FIG. 1A, a plurality of through integrated fan-out vias (TIVs) 15 are formed on the polymer layer 12. In some embodiments, the TIV 15 includes a seed layer 13 and a conductive post 14 on the seed layer 13. The seed layer 13 is a metal seed layer such as a copper seed layer. For example, the seed layer 13 may include titanium, copper, the like, or a combination thereof. In some embodiments, the seed layer includes a first seed layer 13a and a second seed layer 13b over the first seed layer 13a (FIG. 2A). The first seed layer 13a and the second seed layer 13b may include different materials. For example, the first seed layer is a titanium layer, and the second seed layer is a copper layer. In some embodiments, the conductive post 14 include a material the same as the second seed layer 13b and different from the first seed layer 13a. The conductive post 14 includes a suitable metal, such as copper. However, the disclosure is not limited thereto. The sidewalls of the conductive posts 14 may be substantially aligned with the sidewalls of the seed layer 13. The sidewalls of the TIVs 15 may be substantially straight, inclined, arced or the like.

The TIVs 15 may be formed by the following processes: a seed material layer is formed on the polymer layer 12 by a physical vapor deposition (PVD) process such as sputtering. A patterned mask layer is then formed on the seed material layer, the patterned mask layer has a plurality of openings exposing a portion of the seed material layer at the intended locations for the subsequently formed TIVs 15. Thereafter, the conductive posts 14 are formed on the seed material layer within the openings by a plating process, such as electroplating. Thereafter, the patterned mask layer is stripped by an ashing process, for example. The seed material layer not covered by the conductive posts 14 is removed by an etching process using the conductive posts 14 as the etching mask. As such, the seed layers 13 underlying the conductive posts 14 are remained, the seed layer 13 and the conductive post 14 constitute the TIV 15.

Figure 1B:
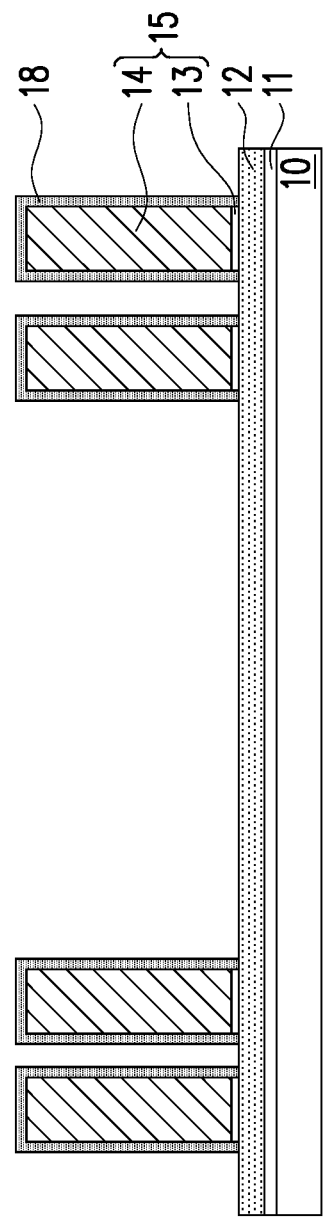

Referring to FIG. 1B, in some embodiments, adhesion promoter material layers 18 are formed on the TIVs 15 to cover the top surfaces and sidewalls of the TIVs 15. The adhesion promoter material layer 18 may include a metal chelate compound, such as copper chelate. The metal chelate compound included in the adhesion promoter material layer 18 is corresponding to the metal included in the TIV 15. That is, the adhesion promoter material layer 18 and the TIV 15 include a same metal element. In some embodiments, the adhesion promoter material layer 18 may be formed by conducting a chelation reaction between a chelating agent and the TIV 15.

Figure 4:
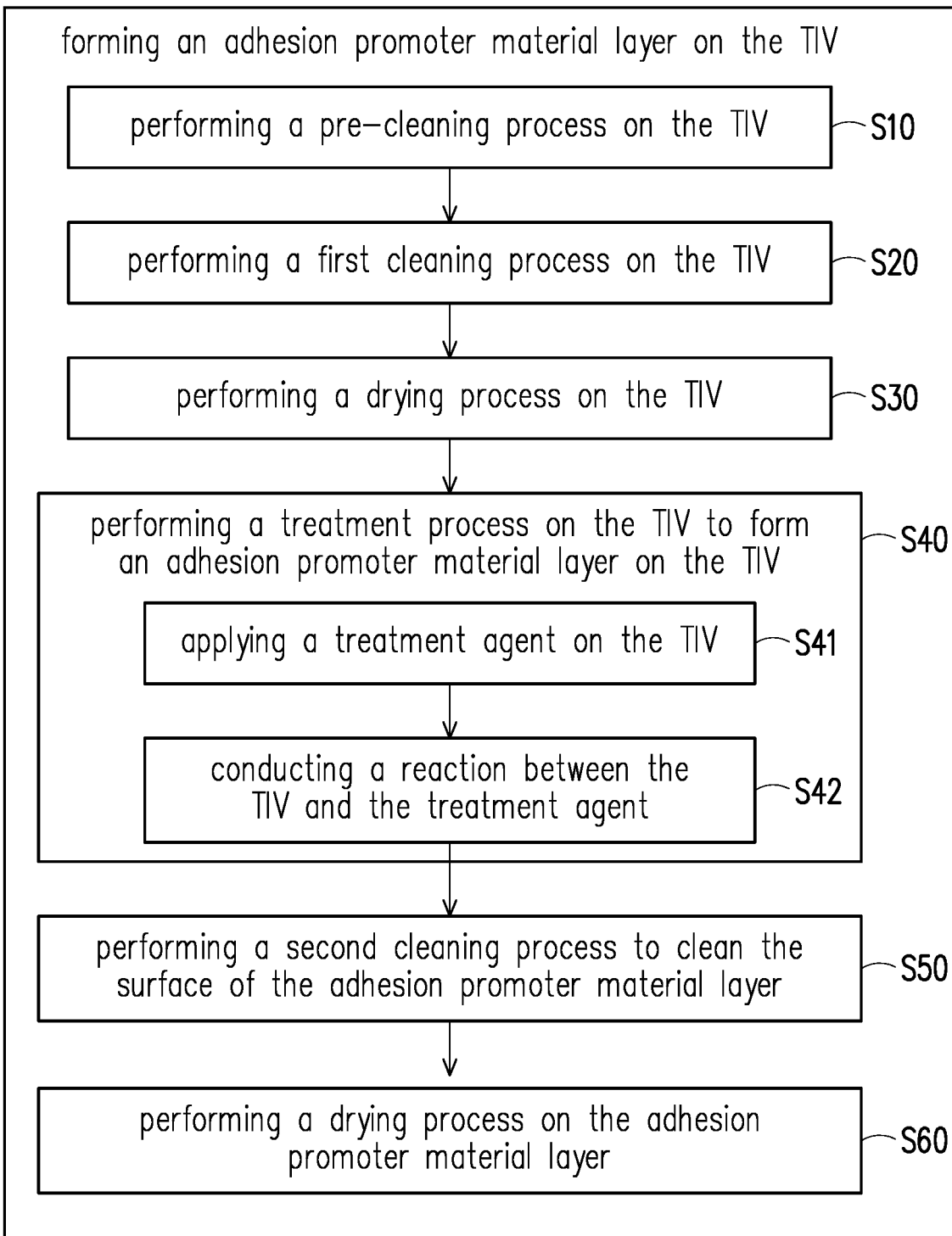
FIG. 4 is a flowchart illustrating a method of forming an adhesion promoter layer on a TIV according to some embodiments of the disclosure.

Referring to FIG. 1B and FIG. 4, for example, the adhesion promoter material layers 18 may be formed by the following processes: after the TIVs 15 are formed, in step S10, a pre-cleaning process is performed on the TIVs 15 to clean the surfaces of the TIVs 15. The detergent used in the pre-cleaning process may include an acid such as citric acid (CX-100), hydrochloric acid, sulfuric acid, acetic acid, or the like or combinations thereof. The pre-cleaning process may be performed at room temperature for 5 seconds to 10 minutes, such as 1 minute, for example, but the disclosure is not limited thereto. The pre-cleaning process may remove undesired substance on the surface of the TIVs 15, such as impurities or metal oxide. In some embodiments, after the TIV 15 is formed, the metal included in the TIV 15 may be oxidized when exposed to moisture or air for a period of time, and metal oxide such as copper oxide may be formed on the surface of the TIV 15. In the embodiments in which the surface of the TIV 15 is oxidized, the metal oxide on the surface of the TIV 15 is removed by the pre-cleaning process.

Thereafter, in step S20, a first cleaning process is further performed to clean the surfaces of the TIVs 15. In some embodiments, the first cleaning process may remove the remnant generated from the pre-cleaning process, such as the reaction product of the detergent and the metal oxide, the remained detergent, impurities, or combinations thereof. The first cleaning process may be a deionized water rinsing process, and may be performed for 5 seconds to 10 minutes, such as 1 minute, for example. However, the disclosure is not limited thereto.

After the first cleaning process is performed, in step S30, a drying process is performed to dry the surfaces of the TIVs 15. In some embodiments, the structure shown in FIG. 1B is placed in a drying apparatus, and the drying process is performed by introducing an inert gas such as dry nitrogen gas into the drying apparatus, so as to dry the surfaces of the TIVs 15 and also prevent the TIVs 15 from being oxidized again. In some embodiments, the drying process is performed at room temperature for 5 seconds to 10 minutes, such as 1 minute, for example.

Afterwards, in step S40, a treatment process is performed on the TIVs 15 by applying a treatment agent on the TIVs 15 (step S41) and conducting a reaction (such as a chelating reaction) between the TIVs 15 and the treatment agent (step S42). The method of applying the treatment agent may include dipping, spraying, spin coating, the like, or combinations thereof. The treatment process may be performed at a temperature ranging from room temperature to 80° C. or at 40° C. In some embodiments, the treatment process is performed in an alkaline environment, a weak acid environment or a neutral pH environment, but the disclosure is not limited thereto. For example, the pH of the treatment agent may be in a range of 5 to 12 or 8 to 12. The treatment agent includes a chelating agent, and the concentration of the chelating agent may range from 0.01 wt % to 100 wt %. In some embodiments, the chelating agent includes chelating ligands capable of forming coordination bond with the metal (such as copper) of the TIVs 15. For example, the ligand atom of the chelating ligand may include N, O, S, or combinations thereof.

In some embodiments, the chelating agent may be represented by the following general formulas (I):

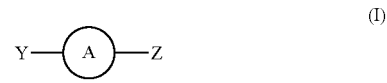

(I)

In the formula (I), A may include a monocyclic ring such as a mono-heterocyclic ring, a bicyclic ring, a tricyclic ring, a tetracyclic ring, or the like, and each ring may be a five-membered ring or a six-membered ring. In some embodiments, A includes conjugated double bonds. In some embodiments, A includes one or more heterocyclic rings such as aromatic heterocyclic rings. The heterocyclic ring may be mono-heterocyclic ring or fused heterocyclic ring. The heterocyclic ring includes heteroatoms such as N, S, O or combinations thereof. However, the disclosure is not limited thereto.

In some embodiments, the general formula (I) may include the following formulas (II)-(XII), for example.

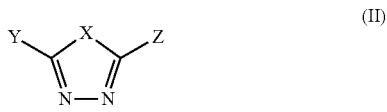

(II)

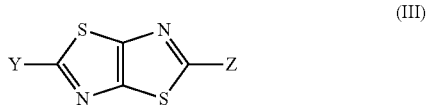

(III)

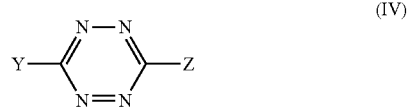

(IV)

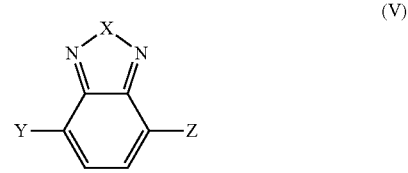

(V)

-continued

(VI)

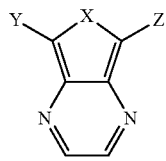
(VII)

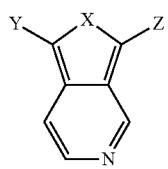
(VIII)

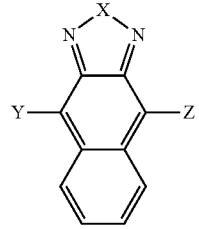
(IX)

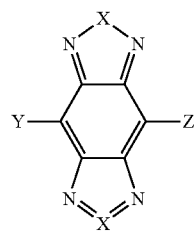
(X)

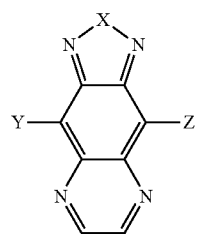
(XI)

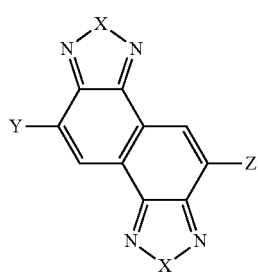
(XII)

In the above formulas, the functional groups X, Y, Z may be the same as or different from each other. X may be —CH, —CR', —NH, —NR', —S, —O, respectively. Y and Z may be —CH$_3$, —CR', —NH$_2$, —RNH$_2$, —NHR', —RNHR', —SH, —RSH, —SR', —RSR', —OH, —ROH, —OR', —R—OR', respectively. In each formula, Y and Z may be the same as or different from each other. R may be a carbon chain, and the carbon chain may be a linear side chain

or a branch side chain such as

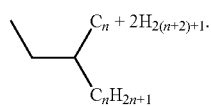

R' may be

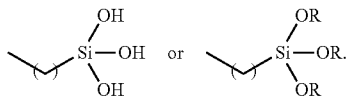

Still referring to FIG. 1B, during the treatment process, a chelating reaction is conducted between the metal of TIVs 15 and the chelating agent, and a metal chelate compound (that is, the adhesion promoter material layer 18) is formed on the surfaces of the TIVs 15. During the chelating reaction, metal atoms or metal cations on the surface of or diffused from the TIVs 15 chelates with the chelating agent, and coordinate bonds are formed between the metal atoms or cations and the chelating ligands of the chelating agent. In some embodiments in which the TIV 15 includes copper, the metal cations may be $Cu^+$ or $Cu^{2+}$. In some embodiments, the coordination bonds may be formed between the respective metal atom or cation and the same or different types of chelating ligands of the chelating agent.

Referring to FIG. 1B, in some embodiments, the chelating agent has a specific affinity for the metal included in TIV 15, and only reacts with the TIV 15 without reacting with the polymer layer 12. Therefore, the adhesion promoter material layer 18 is selectively formed on the surfaces of the TIVs 15 by the treatment process.

In some embodiments, the duration of the treatment process may range from 5 seconds to 10 minutes, for example. However, the disclosure is not limited thereto. The duration of the treatment process may be adjusted depending on the required thickness of the adhesion promoter material layer 18 according to product design. In some embodiments, the thickness of the adhesion promoter material layer 18 increases as the duration of the treatment process increases. The thickness increase rate of the adhesion promoter material layer 18 may be reduced over time. It is because as the thickness of the adhesion promoter material layer 18 increases, the time required for metal cations to diffuse outside the metal chelate to react with the chelating agent increases.

In some embodiments, as illustrated in step S50 of FIG. 4, a second cleaning process is then performed to clean the surfaces of the adhesion promoter material layers 18. The second cleaning process may be a deionized water rinsing process, and may be performed for 5 seconds to 10 minutes, such as 1 minute. Thereafter, in step S60, a drying process may be performed to dry the surface of the adhesion promoter material layer 18. The drying process may be performed using dry air. In some embodiments, the drying process is performed at room temperature for 5 seconds to 10 minutes, such as 1 minute, for example. As such, the formation of the adhesion promoter material layer 18 is thus completed.

Referring to FIG. 1B and FIG. 2A, in some embodiments, the sidewalls and top surfaces of the conductive post 14 are covered, such as completely covered by the adhesion promoter material layer 18. The sidewalls of the seed layer 13 may be partially covered or completely covered by the adhesion promoter material layer 18. In some embodiments in which the seed layer 13 includes first and second seed layers 13a and 13b, and the conductive post 14 and the second seed layer 13b includes the same metal such as copper, and the first seed layer 13a include a metal (such as titanium) different from the second seed layer 13b, the chelating agent may react with the copper included in the conductive post 14 and the second seed layer 13b without reacting with titanium included in the first seed layer 13a. In some embodiments, the metal chelate produced by the chelating reaction is formed on and cover the sidewalls of the conductive post 14 and the second seed layer 13b and may further extend to (partially or completely) cover the sidewalls of the first seed layer 13a. In other words, the adhesion promoter material layer 18 is in physical contact with the first seed layer 13a, the second seed layer 13b and the conductive post 14 of the TIV 15. Chemical bonds such as coordination bonds are formed between the second seed layer 13b and the adhesion promoter material layer 18, and between the conductive post 14 and the adhesion promoter material layer 18, while no chemical bond is formed between the first seed layer 13a and the adhesion promoter material layer 18.

Figure 1C:
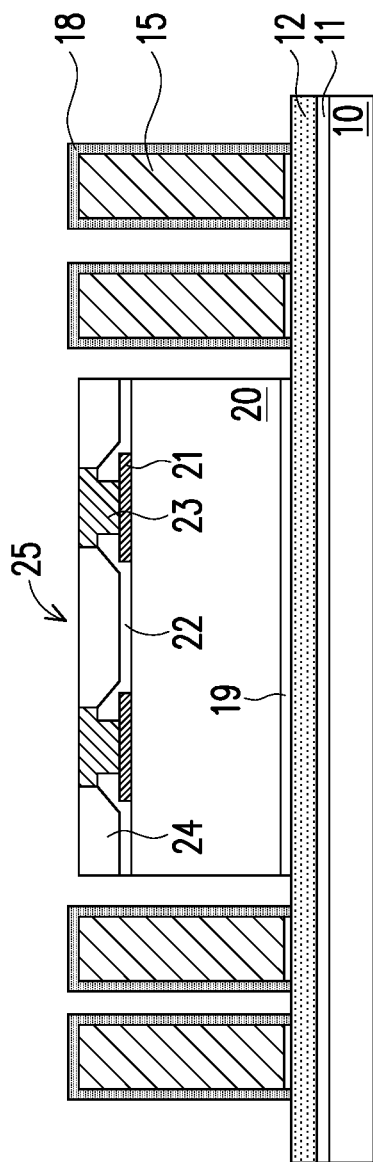

Referring to FIG. 1C, a die 25 is mounted on the polymer layer 12 by pick and place processes. In some embodiments, the die 25 is attached to the polymer layer 12 through an adhesive layer 19 such as a die attach film (DAF), silver paste, or the like. In some embodiments, the die 25 is one of a plurality of dies cut apart from a wafer, for example. The die 25 may be an application-specific integrated circuit (ASIC) chip, an analog chip, a sensor chip, a wireless and radio frequency chip, a voltage regulator chip or a memory (such as DRAM) chip. The number of the die 25 shown in FIG. 1C is merely for illustration, and the disclosure is not limited thereto. In some embodiments, two or more dies 25 may be disposed side by side on the polymer layer 12 over the carrier 10, and the two or more dies 25 may be the same types of dies or the different types of dies.

Still referring to FIG. 1C, the die 25 is disposed on the polymer layer 12 and laterally between the TIVs 15, that is, the TIVs 15 are laterally aside or around the die 25. In some embodiments, the die 25 includes a substrate 20, a plurality of pads 21, a passivation layer 22, a plurality of connectors 23 and a passivation layer 24. In some embodiments, the substrate 20 is made of silicon or other semiconductor materials. Alternatively or additionally, the substrate 20 includes other elementary semiconductor materials such as germanium, gallium arsenic, or other suitable semiconductor materials. In some embodiments, the substrate 20 may further include other features such as various doped regions, a buried layer, and/or an epitaxy layer. Moreover, in some embodiments, the substrate 20 is made of an alloy semiconductor such as silicon germanium, silicon germanium carbide, gallium arsenic phosphide, or gallium indium phosphide. Furthermore, the substrate 20 may be a semiconductor on insulator such as silicon on insulator (SOI) or silicon on sapphire.

In some embodiments, a plurality of devices are formed in or on the substrate 20. The devices may be active devices, passive devices, or combinations thereof. In some embodiments, the devices are integrated circuit devices. The devices are, for example, transistors, capacitors, resistors, diodes, photodiodes, fuse devices, or the like, or combinations thereof.

In some embodiments, an interconnection structure and a dielectric structure are formed over the devices on the substrate 20. The interconnection structure is formed in the dielectric structure and connected to different devices to form a functional circuit. In some embodiments, the dielectric structure includes an inter-layer dielectric layer (ILD) and one or more inter-metal dielectric layers (IMD). In some embodiments, the interconnection structure includes multiple layers of metal lines and plugs (not shown). The metal lines and plugs include conductive materials, such as metal, metal alloy or a combination thereof. For example, the conductive material may include tungsten (W), copper (Cu), copper alloys, aluminum (Al), aluminum alloys, or combinations thereof. The plugs include contact plugs and via plugs. The contact plugs are located in the ILD to be connected to the metal lines and the devices. The via plugs are located in the IMD to be connected to the metal lines in different layers.

The pads 21 may be or electrically connected to a top conductive feature of the interconnection structure, and further electrically connected to the devices formed on the substrate 20 through the interconnection structure. The material of the pads 21 may include metal or metal alloy, such as aluminum, copper, nickel, or alloys thereof.

The passivation layer 22 is formed over the substrate 20 and covers a portion of the pads 21. Another portion of the pads 21 is exposed by the passivation layer 22 and serves as an external connection of the die 25. The connectors 23 are formed on and electrically connected to the pads 21 not covered by the passivation layer 22. The connector 23 includes solder bumps, gold bumps, copper bumps, copper posts, copper pillars, or the like. The passivation layer 24 is formed over the passivation layer 22 and laterally aside the connectors 23 to cover the sidewalls of the connectors 23. The passivation layers 22 and 24 respectively include an insulating material such as silicon oxide, silicon nitride, polymer, or a combination thereof. The polymer may include polybenzoxazole (PBO), polyimide (PI), benzocyclobutene (BCB), the like, or combinations thereof. The materials of the passivation layer 22 and the passivation layer 24 may be the same or different. In some embodiments, the top surface of the passivation layer 24 and the top surfaces of the connectors 23 are substantially coplanar with each other.

Figure 1D:
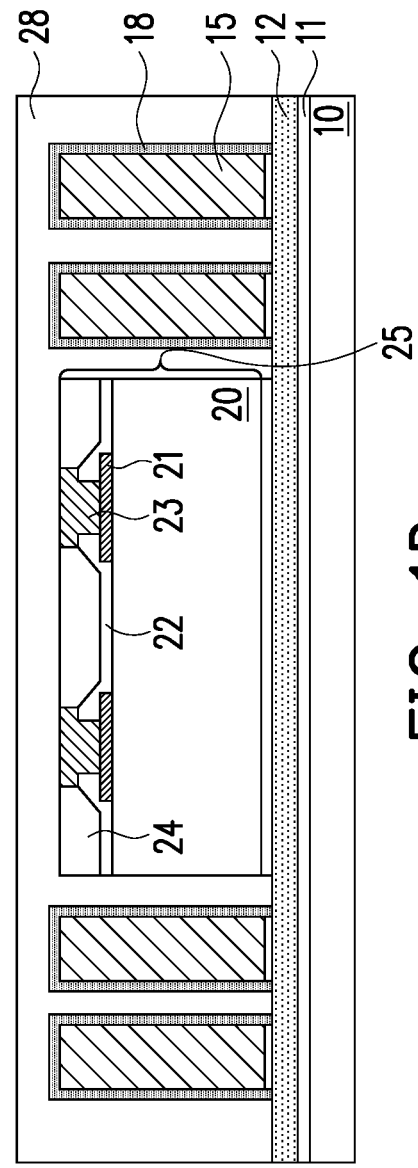

Referring to FIG. 1D, an encapsulant material layer 28 is then formed over the carrier 10 to encapsulate the die 25, the TIVs 15 and the adhesion promoter material layer 18. Specifically, the encapsulant material layer 28 is formed on the polymer layer 12, encapsulating sidewalls and top surfaces of the die 30, sidewalls and top surfaces of the adhesion promoter material layer 18. The adhesion promoter material layer 18 is sandwiched between the TIVs 15 and the encapsulant material layer 28. In some embodiments, the adhesion promoter material layer 18 includes a functional group (such as the functional group X, Y, Z in the above formulas) which may react with the encapsulant material layer 28, and chemical bonds may be formed between the adhesion promoter material layer 18 and the encapsulant material layer 28.

In some embodiments, the encapsulant material layer 28 includes a molding compound, a molding underfill, a resin such as epoxy, a combination thereof, or the like. In some other embodiments, the encapsulant material layer 28 includes a photo-sensitive material such as polybenzoxazole (PBO), polyimide (PI), benzocyclobutene (BCB), a combination thereof, or the like, which may be easily patterned by exposure and development processes or laser drilling process. In alternative embodiments, the encapsulant material layer 28 includes nitride such as silicon nitride, oxide such as silicon oxide, phosphosilicate glass (PSG), borosilicate glass (BSG), boron-doped phosphosilicate glass (BPSG), a combination thereof, or the like.

In some embodiments, the encapsulant material layer 28 includes a composite material including a base material (such as polymer) and a plurality of fillers distributed in the base material. The filler may be a single element, a compound such as nitride, oxide, or a combination thereof. The fillers may include silicon oxide, aluminum oxide, boron nitride, alumina, silica, or the like, for example. In some embodiments, the fillers may be spherical fillers, but the disclosure is not limited thereto. The cross-section shape of the filler may be circle, oval, or any other shape. In some embodiments, the encapsulant material layer 28 is formed by a suitable fabrication technique such as molding, spin-coating, lamination, deposition, or similar processes.

Figure 1E:
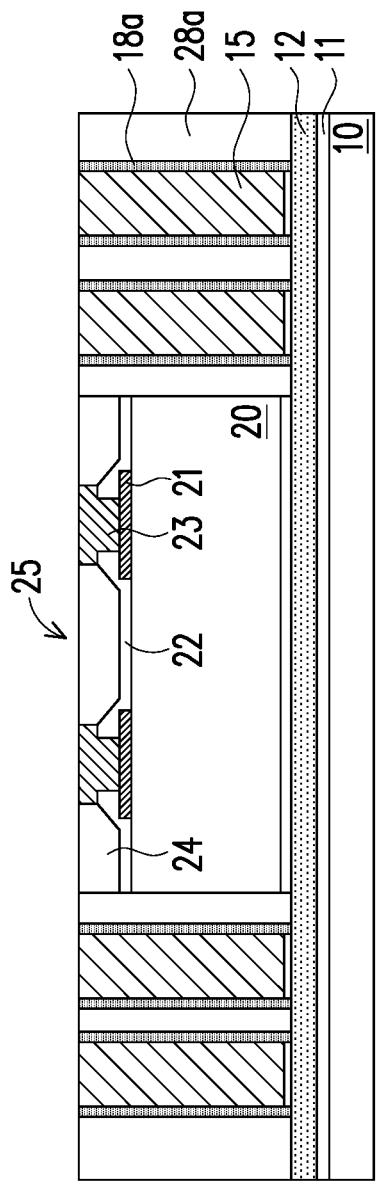

Referring to FIG. 1E, in some embodiments, a planarization process is performed to remove a portion of the encapsulant material layer 28 over the top surfaces of the die 25 and the TIVs 15 and portions of the adhesion promoter material layers 18 on the top surfaces of the TIVs 15, such that the top surfaces of the connectors 23 of the die 25 and the top surfaces of the TIVs 15 are exposed. The planarization process includes a grinding or polishing process such as a chemical mechanical polishing (CMP) process.

Still referring to FIG. 1E, after the planarization process is performed, a plurality of adhesion promoter layers 18a and an encapsulant 28a are formed. The adhesion promoter layers 18a are located on the polymer layer 12 and laterally aside the TIVs 15, surrounding the sidewalls of the TIVs 15. The encapsulant 28a is located on the polymer layer 12 and laterally aside the die 25, the adhesion promoter layer 18a and the TIVs 15, encapsulating sidewalls of the die 25, sidewalls of the adhesion promoter layer 18a and sidewalls of the TIVs 15. The adhesion promoter layer 18a is sandwiched between and in physical contact with the TIV 15 and the encapsulant 28a. In other word, the encapsulant 28a is not in direct physical contact with the TIV 15, and separated from the TIV 15 by the adhesion promoter layer 18a therebetween. In some embodiments, the top surface of the die 25, the top surfaces of the TIVs 15, the top surface of the adhesion promoter layer 18a and the top surface of the encapsulant 28a are substantially coplanar with each other.

Figure 1F:
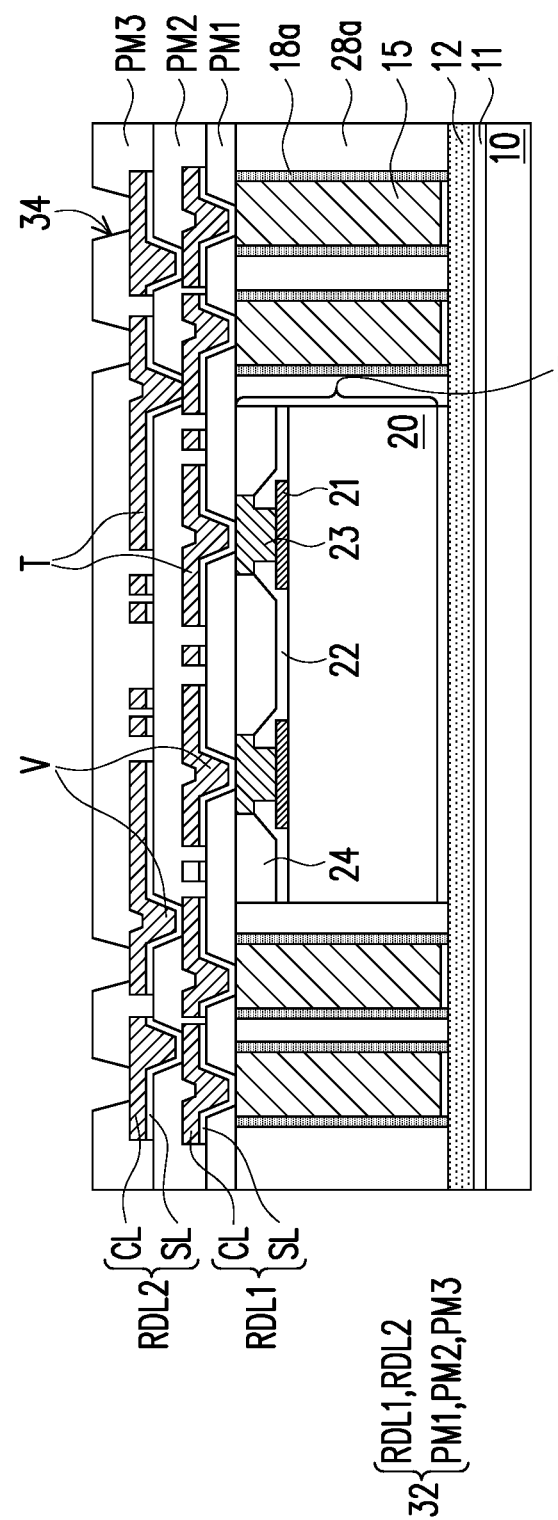

Referring to FIG. 1F, a redistribution layer (RDL) structure 32 is formed on the die 25, the TIVs 15, and the encapsulant 28a. The RDL structure 32 is electrically connected to the die 25 and the TIVs 15. In some embodiments, the RDL structure 32 is referred to as a front-side RDL structure of the die 30. Through the specification, wherein the "front-side" refers to a side close to the connectors of the die.

In some embodiments, the RDL structure 32 includes a plurality of polymer layers PM1, PM2 and PM3 and a plurality of redistribution layers RDL1 and RDL2 stacked alternately. The number of the polymer layers or the redistribution layers shown in FIG. 1F is merely for illustration, and the disclosure is not limited thereto.

The redistribution layer RDL1 penetrates through the polymer layer PM1 and is electrically connected to the connectors 23 of the die 25 and the TIVs 15. The redistribution layer RDL2 penetrates through the polymer layer PM2 and is electrically connected to the redistribution layer RDL1. The polymer layer PM3 is located on and covers the polymer layer PM2 and the redistribution layer RLD2.

In some embodiments, each of the polymer layers PM1, PM2, and PM3 includes a photo-sensitive material such as polybenzoxazole (PBO), polyimide (PI), benzocyclobutene (BCB), a combination thereof or the like. In some embodiments, each of the redistribution layers RDL1 and RDL2 includes conductive materials. The conductive materials includes metal such as copper, aluminum, nickel, titanium, alloys thereof, a combination thereof or the like, and is formed by a physical vapor deposition (PVD) process such as sputtering, a plating process such as electroplating, or a combination thereof. In some embodiments, the redistribution layers RDL1 and RDL2 include a seed layer SL and a conductive layer CL formed thereon, respectively. The seed layer SL may be a metal seed layer such as a copper seed layer. In some embodiments, the seed layer includes a first seed layer such as a titanium layer and a second seed layer such as a copper layer over the first seed layer. The metal layer may be copper or other suitable metals.

In some embodiments, the redistribution layers RDL1 and RDL2 respectively includes a plurality of vias V and a plurality of traces T connected to each other. The vias V are embedded in and penetrate through the polymer layers PM1 and PM2, to connect the traces T of the redistribution layers RDL1 and RDL2, and the traces T are located on the polymer layers PM1 and PM2, and are extending on the top surface of the polymer layers PM1 and PM2, respectively.

Still referring to FIG. 1F, in some embodiments, the polymer layer PM3 is patterned to form a plurality of openings 34. The openings 34 expose a portion of the top surface of the redistribution layer RDL2. In some embodiments, conductive terminals may be formed on the redistribution layer RDL2 exposed by the openings 34, but the disclosure is not limited thereto. In alternative embodiments, a plurality of TIVs may be formed on the redistribution layer RDL2, and one or more dies may further be stacked on the RDL structure 32.

Figure 1G:
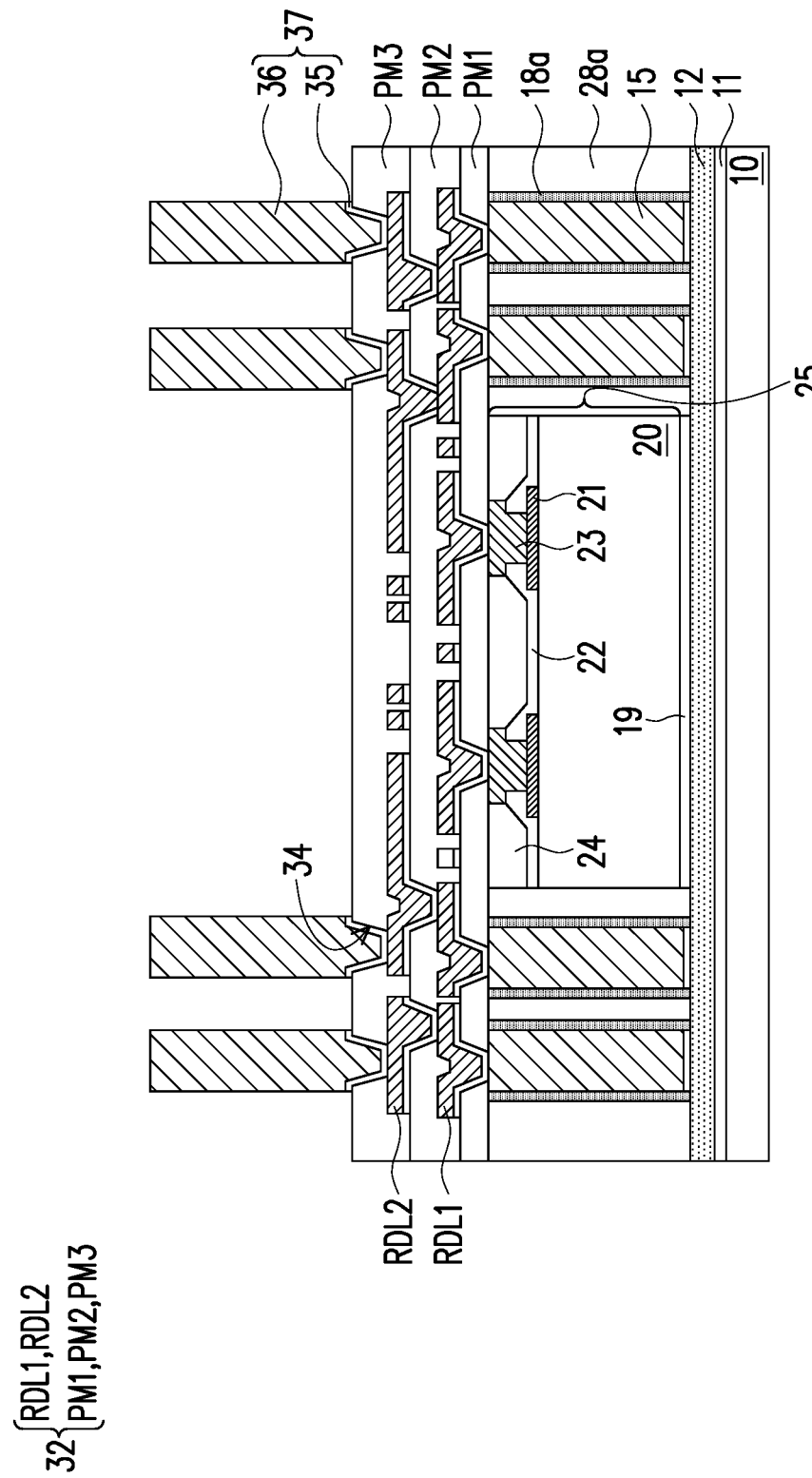

Referring to FIG. 1G, in some embodiments, a plurality of the TIVs 37 are formed on the redistribution layer RDL2 exposed by the openings 34 of the polymer layer PM3. The TIV 37 includes a seed layer 35 and a conductive post 36 on the seed layer 35. The materials and forming method of the TIV 37 are similar to, and may be the same as or different from those of the TIV 15. In some embodiments, the seed layer 35 is a metal seed layer such as a copper seed layer. For example, the seed layer 35 may include titanium, copper, the like, or a combination thereof. In some embodiments, the seed layer 35 includes a first seed layer 35a such as a titanium layer and a second seed layer 35b such as a copper layer over the first seed layer 35a (FIG. 2B). The conductive post 36 includes a suitable metal, such as copper. The seed layer 35 covers the surface of the opening 34 and a portion of the top surface of the polymer layer PM3. The conductive post 36 covers the surface of the seed layer 35, filling the opening 34 and protruding from the top surface of the polymer layer PM3. It is noted that, the number of the TIVs 37 shown in FIG. 1G is merely for illustration, and the disclosure is not limited thereto.

Figure 1H:
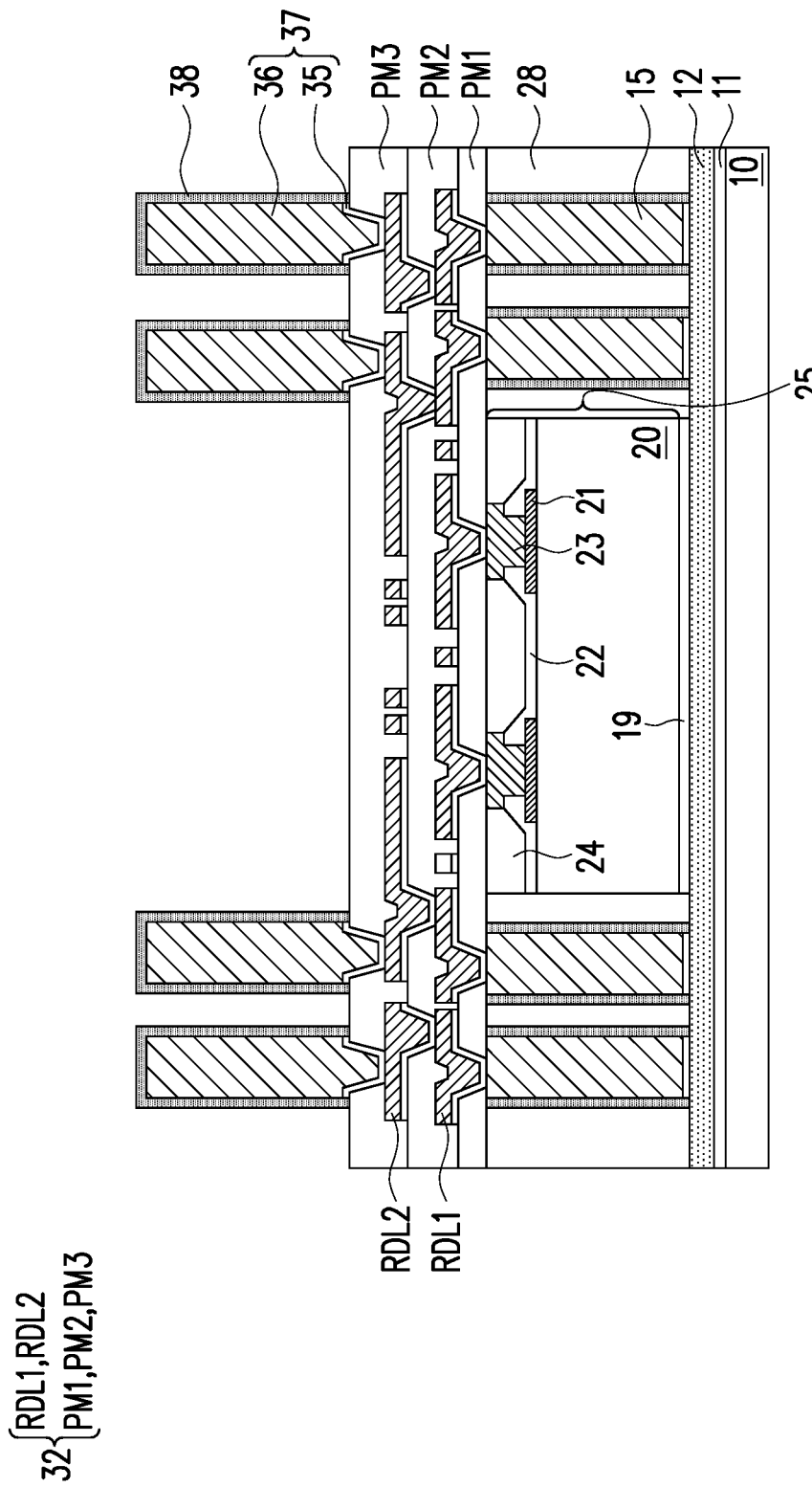
Figure 11:
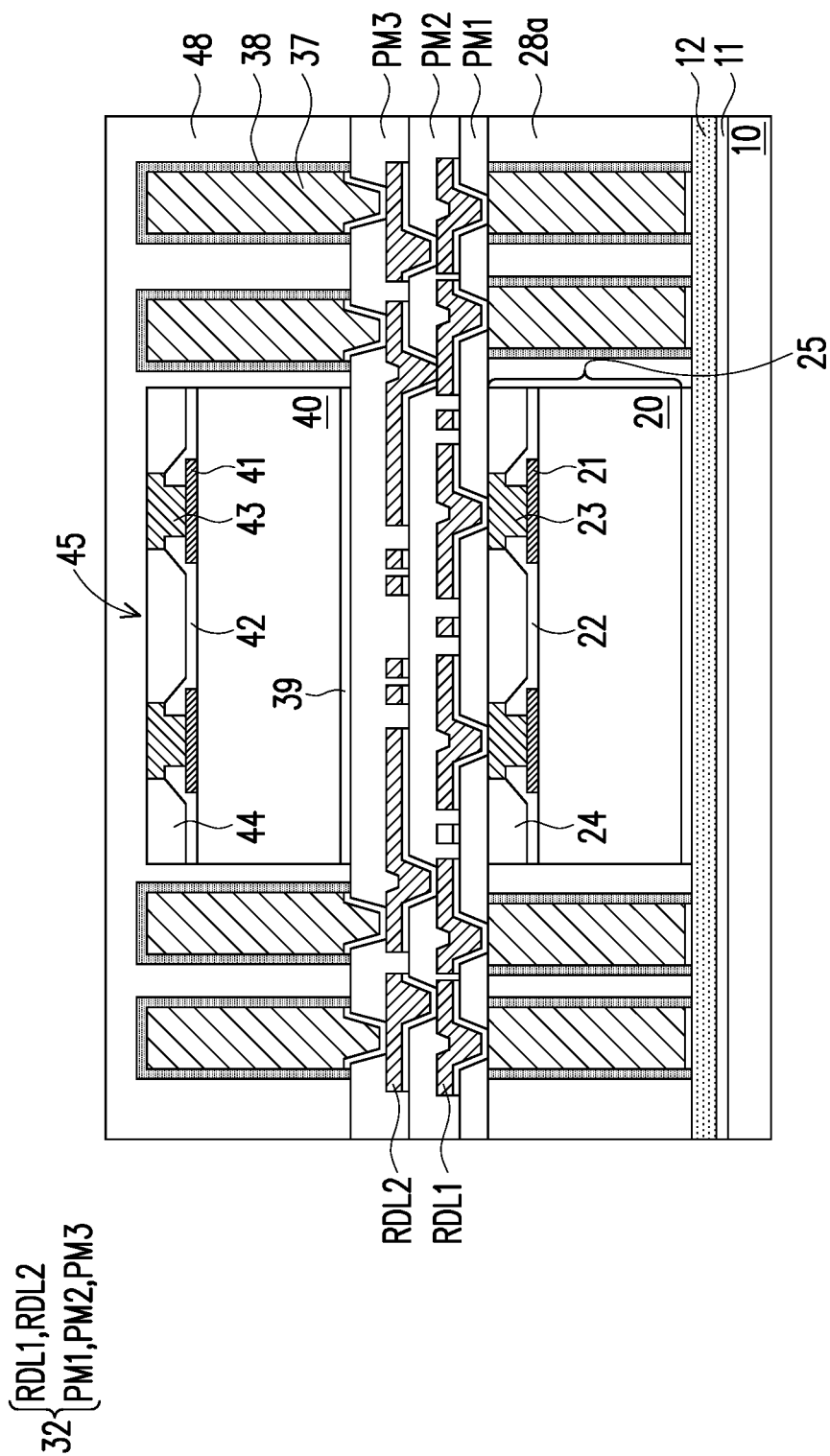

Referring to FIG. 1H, an adhesion promoter material layer 38 is then formed to cover the sidewalls and top surfaces of the TIVs 37. In some embodiments, the adhesion promoter material layer 38 includes a metal chelate, such as copper chelate. The forming method of the adhesion promoter material layer 38 is similar to, and may be substantially the same as or different from that of the adhesion promoter material layer 18, which is not described again here.

The adhesion promoter material layer 38 covers the sidewalls and the top surface of the conductive post 36, and the sidewalls of the seed layer 35 on the top surface of the polymer layer PM3.

Referring to FIG. 1I, a die 45 is mounted on the polymer layer PM3 of the RDL structure 32 by pick and place processes. In some embodiments, the die 45 is attached to the polymer layer PM3 through an adhesive layer 39 such as a die attach film (DAF), silver paste, or the like. The die 45 may be an application-specific integrated circuit (ASIC) chip, an analog chip, a sensor chip, a wireless and radio frequency chip, a voltage regulator chip or a memory chips. The number of the die 45 shown in FIG. 1I is merely for illustration, and the disclosure is not limited thereto. In some embodiments, two or more dies 45 may be mounted on the polymer layer PM3 of the RDL structure 32, and the two or more dies 45 may be the same types of dies or the different types of dies. The die 45 and the die 25 may be the same types of dies or different types of dies. The structure of the die 45 is similar to, and may be the same as or different from the structure of the die 25.

In some embodiments, the die 45 includes a substrate 40, a plurality of pads 41, a passivation layer 42, a plurality of connectors 43 and a passivation layer 44. The materials, forming method, and structural features of the substrate 40, the pads 41, the passivation layer 42, the connectors 43 and the passivation layer 44 of the die 45 are substantially the same as those of the die 25, which are not described again here.

Still referring to FIG. 1I, an encapsulant material layer 48 is then formed on the RDL structure 32 to encapsulant sidewalls and top surfaces of the die 45, the TIVs 37 and the adhesion promoter material layer 38. The material and forming method of the encapsulant material layer 48 are similar to, and may be the same as or different from those of the encapsulant material layer 28 (FIG. 1D).

Figure 1J:
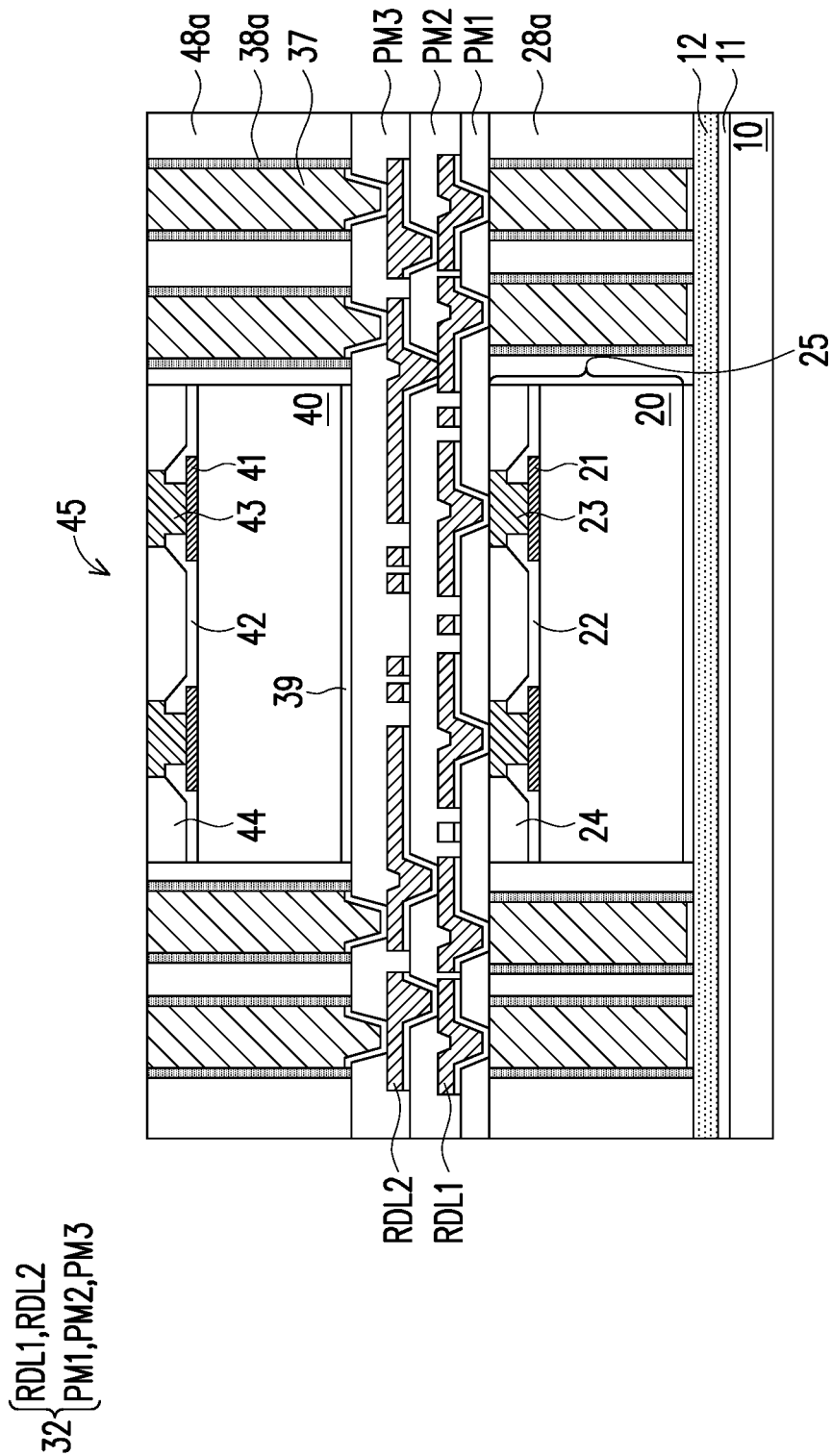

Referring to FIG. 1J, in some embodiments, a planarization process is then performed to expose the top surfaces of the connectors 43 of the die 45 and top surfaces of the TIVs 37. The planarization process may include a grinding or polishing process such as a CMP process. In some embodiments, a portion of the encapsulant material layer 48 over the top surfaces of the die 45 and the TIVs 37 and portions of the adhesion promoter material layer 38 on the top surfaces of the TIVs 37 are removed by the planarization process, and an encapsulant 48a and an adhesion promoter layer 38a are remained. In some embodiments, after the planarization process is performed, the top surface of the die 45, the top surfaces of the TIVs 37, the top surfaces of the adhesion promoter layers 38a and the top surface of the encapsulant 48a are substantially coplanar with each other.

Figure 1K:
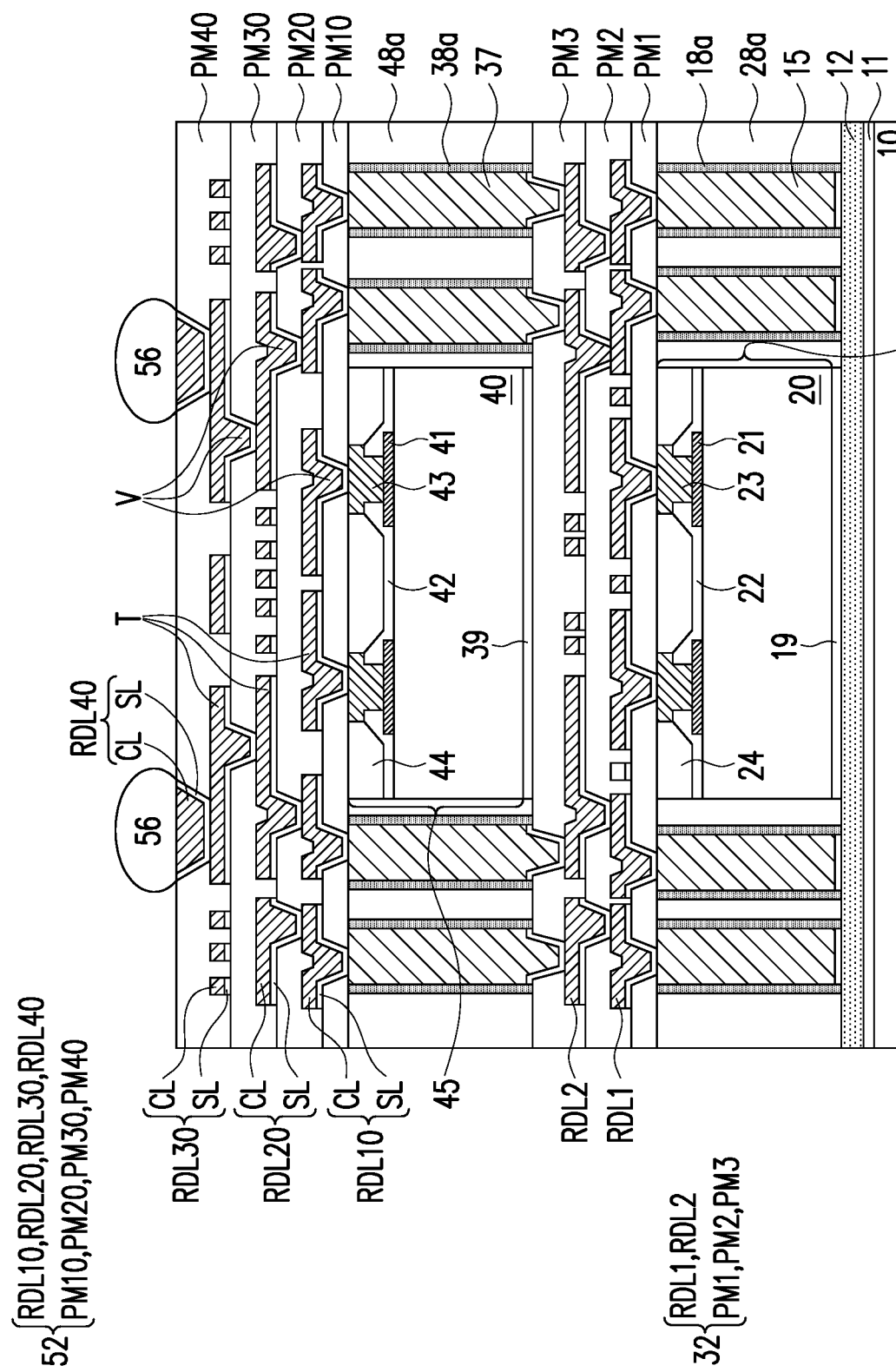

Referring to FIG. 1K, a RDL structure 52 is then formed on the die 45, the TIVs 37 and the encapsulant 48a. The RDL structure 52 is electrically connected to the die 45 and the TIVs 37. In some embodiments, the RDL structure 52 includes a plurality of polymer layers PM10, PM20, PM30 and PM40, and a plurality of redistribution layers RDL10, RDL20, RDL30 and RDL40 stacked alternately. The number of the polymer layers or the redistribution layers shown in FIG. 1K is merely for illustration, and the disclosure is not limited thereto. The materials and forming method of the polymer layers and redistribution layers of the RDL structure 52 are similar to, and may be the same as or different from those of the RDL structure 32.

The redistribution layer RDL10 penetrates through the polymer layer PM10 and is electrically connected to the connectors 43 of the die 45 and the TIVs 37. The redistribution layer RDL20 penetrates through the polymer layer PM20 and is electrically connected to the redistribution layer RDL10. The redistribution layer RDL30 penetrates through the polymer layer PM30 and is electrically connected to the redistribution layer RDL20. The redistribution layer RDL40 penetrates through the polymer layer PM40 and is electrically connected to the redistribution layer RDL30.

In some embodiments, similar to the redistribution layers RDL1 and RDL2, the redistribution layers RDL10, RDL20, RDL30, and RDL40 include a seed layer SL and a conductive layer CL formed thereon, respectively. In some embodiments, the redistribution layers RDL10, RDL20, RDL30 respectively includes a plurality of vias V and a plurality of traces T connected to each other. The vias V are embedded in and penetrate through the polymer layers PM10, PM20, PM30, to connect the traces T of the redistribution layers RDL10, RDL20, RDL30, the traces T are located on the polymer layers PM10, PM20, PM30, and are extending on the top surface of the polymer layers PM10, PM20, PM30, respectively.

In some embodiments, the redistribution layer RDL40 is the topmost redistribution layer of the RDL structure 52, and is referred to as under-ball metallurgy (UBM) layer for ball mounting.

Still referring to FIG. 1K, a plurality of connectors 56 are formed over and electrically connected to the redistribution layer RDL40 of the RDL structure 52. In some embodiments, the connectors 56 are referred as conductive terminals. In some embodiments, the connectors 56 may be ball grid array (BGA) connectors, solder balls, controlled collapse chip connection (C4) bumps, or a combination thereof. In some embodiments, the material of the connector 56 includes copper, aluminum, lead-free alloys (e.g., gold, tin, silver, aluminum, or copper alloys) or lead alloys (e.g., lead-tin alloys). The connector 56 may be formed by a suitable process such as evaporation, plating, ball dropping, screen printing and reflow process, a ball mounting process or a C4 process. In some embodiments, metal posts or metal pillars (not shown) may further be formed between the redistribution layer RDL40 and the connectors 56, but the disclosure is not limited thereto. The connectors 56 are electrically connected to the connectors 43 of the die 45 and the TIVs 37 through the RDL structure 52, and further electrically connected to the connectors 23 of the die 25 and the TIVs 15 through the RDL structure 32.

Figure 1L:
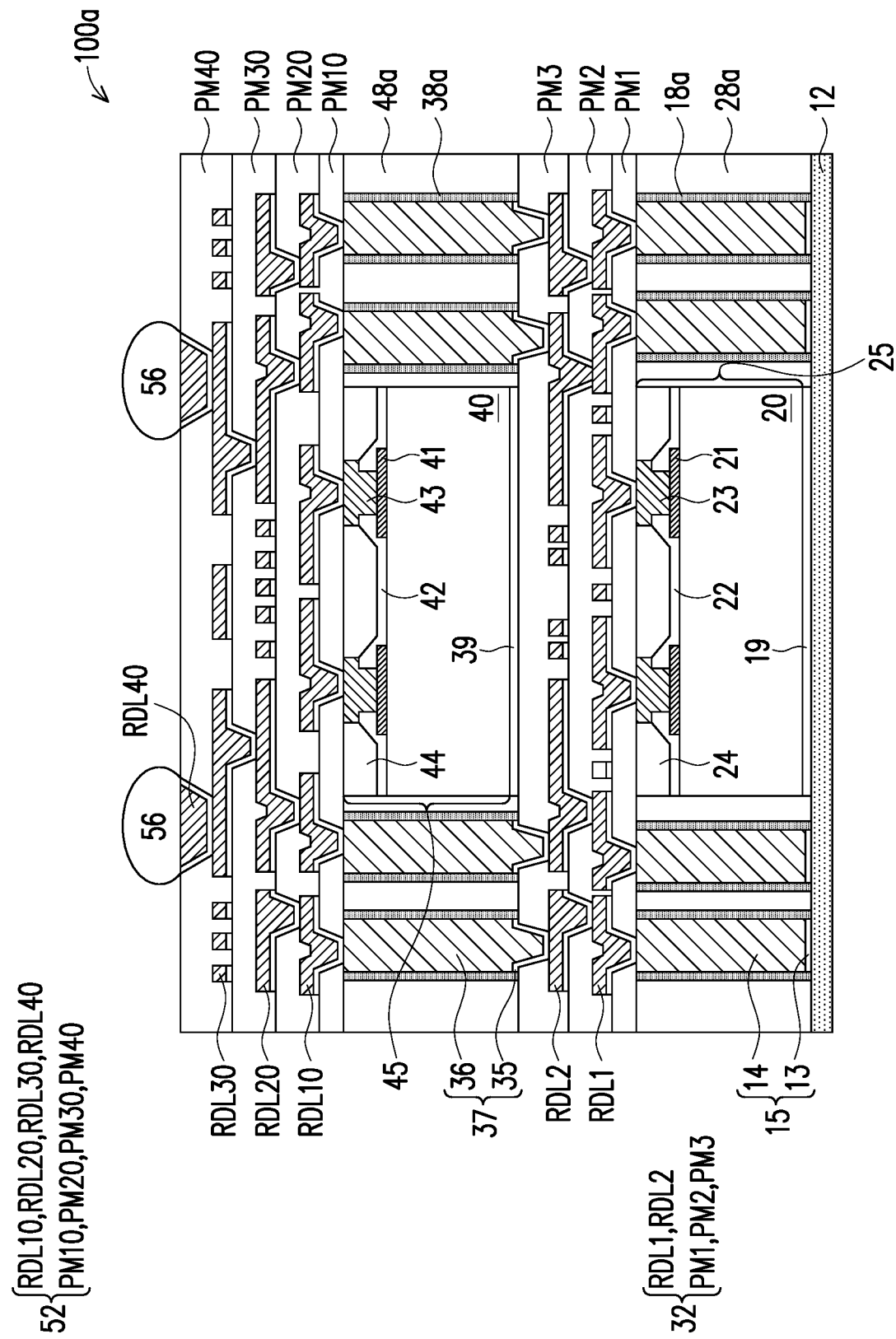

Referring to FIG. 1K and FIG. 1L, in some embodiments, the de-bonding layer 11 is decomposed under the heat of light, and the carrier 10 is then released from the overlying structure, and a package structure 100a is thus formed. In some embodiments, the package structure 100a may further be coupled to other package structures to form a package on package (PoP) device.

Figure 1M:
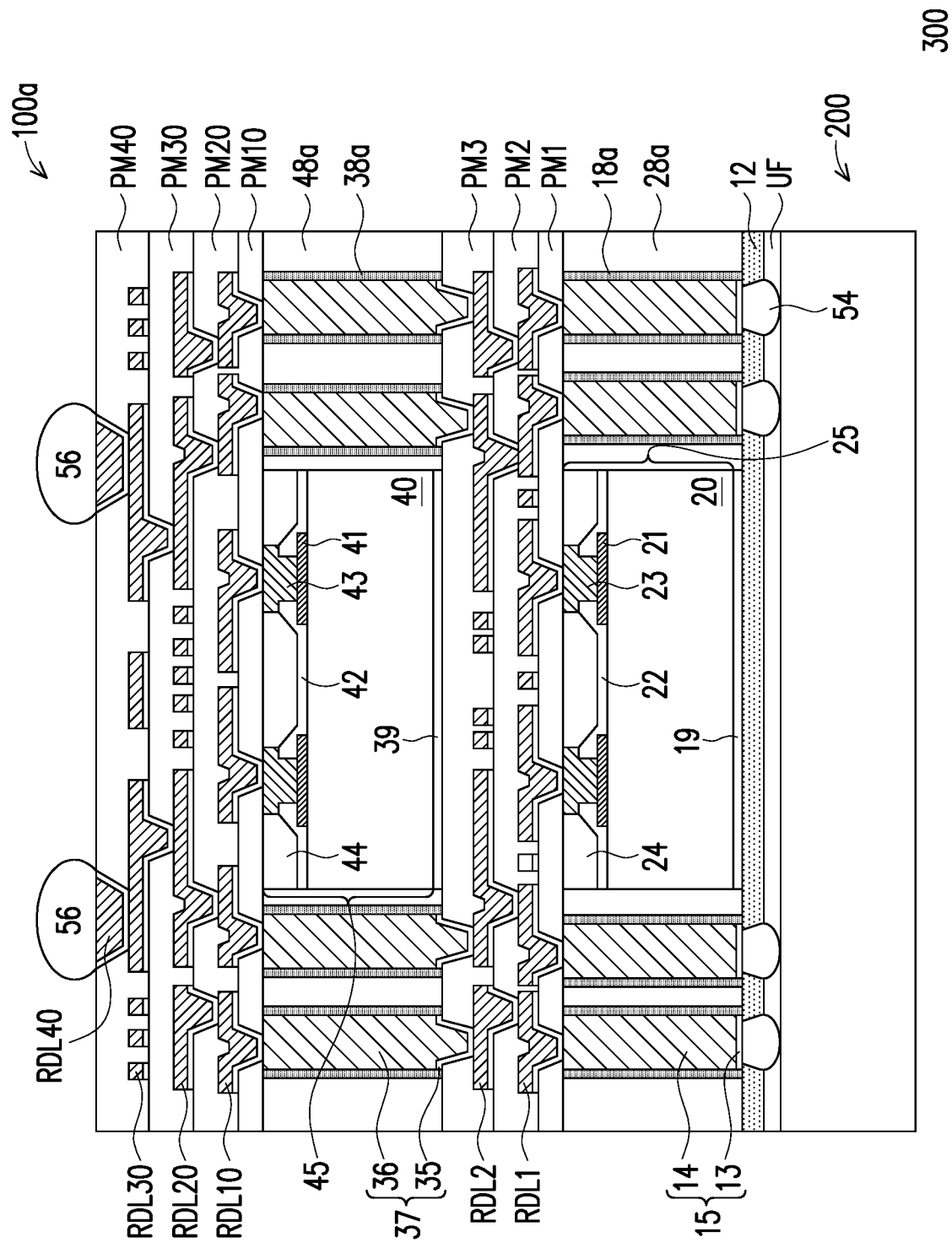

Referring to FIG. 1L and FIG. 1M, portions of the polymer layer 12 may be removed by a laser drilling process to form openings OP in the polymer layer 12. The openings OP expose portions of the bottom surfaces of TIVs 15. Thereafter, the package structure 100a is electrically connected to a package structure 200 to form a PoP device 300 through a plurality of connectors 54. The connectors 54 fill in the openings OP and are electrically connected to the TIVs 15. The package structure 100a and the package structure 200 may include the same types of devices or the different types of devices. The package structure 200 may include active devices, passive devices, or combinations thereof. In some embodiments, the package structure 200 is a memory, such as dynamic random access memory (DRAM), static random access memory (SRAM), or other type of memory. In some embodiments, an underfill layer UF may further be formed to fill the space between the package structure 100a and the package structure 200 and surround the connectors 54.

Referring to FIG. 1L, in some embodiments, the package structure 100a includes the polymer layer 12, the die 25, the TIVs 15, the adhesion promoter layers 18a, the encapsulant 28a, the RDL structure 32, the die 45, the TIVs 37, the adhesion promoter layers 38a, the encapsulant 48a, the RDL structure 52 and the connectors 56. The die 25 and the die 45 are electrically connected to each other through the RDL structure 32, the TIVs 37 and the RDL structure 52. In some embodiments, the polymer layer 12 is disposed on back side of the die 25, the RDL structure 32 is disposed on front side of the die 25 and on back side of the die 45, and the RDL structure 52 is disposed on the front side of the die 45.

The TIVs 15 are laterally aside the die 25, and the encapsulant 28a are laterally aside the die 25 and the TIVs 15, encapsulating sidewalls of the die 25 and sidewalls of the TIVs 15. In some embodiments, the adhesion promoter layers 18a are sandwiched between and in physical contact with the TIVs 15 and the encapsulant 28a. In other words, the sidewalls of the TIVs 15 are covered by the adhesion promoter layers 18a, and separated from the encapsulant 28a by the adhesion promoter layer 18a therebetween. The sidewalls of the adhesion promoter layers 18a are laterally encapsulated by the encapsulant 28a.

Referring to FIG. 1L and FIG. 2A, in some embodiments, the TIV 15 includes the seed layer 13 and the conductive post 14. The seed layer 13 includes a first seed layer 13a such as a titanium layer, and a second seed layer 13b such as a copper layer. In some embodiments, the adhesion promoter layer 18a includes a first portion P1 and a second portion P2 on the first portion P1. For example, the first portion P1 is laterally on sidewalls of the first seed layer 13a of the TIV 15, the second portion P2 is laterally on sidewalls of the second seed layer 13b and the conductive post 14 of the TIV 15. In some embodiments, the second portion P2 is conformal with the second seed layer 13b and the conductive post 14 of the TIV 15, while the first portion P1 is not conformal with the first seed layer 13a of the TIV 15. The shapes of the first portion P1 and the second portion P2 shown in FIG. 2A is merely for illustration, and the disclosure is not limited thereto.

In some embodiments, the thickness T1 of the first portion P1 and the thickness T2 of the second portion P2 are different. Herein, the thickness T1 and the thickness T2 refer to the thicknesses of the first portion P1 and the second portion P2 along a horizontal direction parallel with a top or bottom surface of the die 25, respectively. In some embodiments, the thickness T2 of the second portion P2 may be uniform, while the thickness T1 of the first portion P1 may be decreased gradually from a bottom of the second portion P2 toward the top surface of the polymer layer 12. In other words, the first portion P1 is tapered away from the second portion P2, and tapered toward the top surface of the polymer layer 12. The thickness (i.e. average thickness) T1 of the first portion P1 is less than the thickness T2 of the second portion P2.

In some embodiments, the first portion P1 has an arced surface, which may also be referred as the bottom surface BS of the adhesion promoter layer 18a. In some embodiments, the bottom surface of the TIV 15 and the bottom surface of the encapsulant 28a are substantially coplanar with each other and in contact with the polymer layer 12. The bottom surface of the TIV 15 is not in contact with the adhesion promoter layer 18a. The bottom surface BS of the adhesion promoter layer 18a is higher than the bottom surfaces of the TIV 15 and the encapsulant 28a, and is covered by and in physical contact with the encapsulant 28a. In other words, a portion of the encapsulant 28a is vertically sandwiched between the adhesion promoter layer 18a and the polymer layer 12. The orthographic projection of the adhesion promoter layer 18a on the top surface of the polymer layer 12 is overlapped with the orthographic projection of the portion of the encapsulant 28a on the top surface of the polymer layer 12. It is noted that, the shape of the first portion P1 is merely for illustration, and the disclosure is not limited thereto.

In the illustrated embodiments, the adhesion promoter layer 18a extends to the bottom of the first seed layer 13a and may completely cover the sidewalls of the first seed layer 13a, but the disclosure is not limited thereto. In alternative embodiments, the first portion P1 of the adhesion promoter layer 18a may cover a portion of sidewalls of the first seed layer 13a, and another portion of sidewalls of the first seed layer 13a may be covered by and in physical contact with the encapsulant 28a, as shown in FIG. 2C.

FIG. 2B illustrates an enlarged cross-sectional view of the TIV 37. In some embodiments, the TIV 37 includes a first seed layer 35a, a second seed layer 35b and a conductive post 36. The adhesion promoter layer 38a is laterally sandwiched between the TIV 37 and the encapsulant 48a. In some embodiments, the adhesion promoter layer 38a includes a first portion P10 on sidewalls of the first seed layer 35a and a second portion P20 on sidewalls of the second seed layer 35b and the conductive post 36. Except that a portion of the TIV 37 is embedded in the polymer layer PM3, the other structural features of the TIV 37 and the adhesion promoter layer 38a are substantially the same as those of the TIV 15 and the adhesion promoter layer 18a, which are not described again here.

In the embodiments of the disclosure, the adhesion promoter layer is formed between the TIV and the encapsulant, which may help to improve the adhesion between the TIV and the encapsulant. On the other hand, the adhesion promoter layer may help to avoid or reduce the TIV contacting air or moisture, and therefore the oxidation of the TIV may be avoided or reduced. In some embodiments, the TIVs 15 and 37 of the package structure 100a are not oxidized with the protection of the adhesion promoter layer 18a/38a, but the disclosure is not limited thereto. In alternative embodiments, portions of the TIVs 15 and 37 may still be oxidized. The details are described below taken the TIV 15 as an example.

Figure 3C:
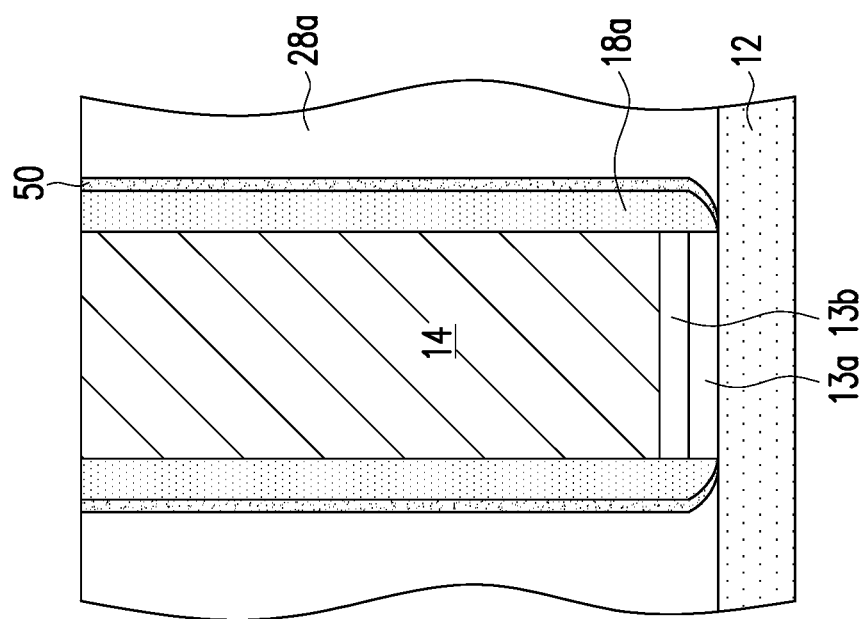

FIG. 3A to FIG. 3C illustrate examples of the oxidation of the TIV 15.

Referring to FIG. 3A to FIG. 3C, in some embodiments, the metal included in the TIV 15 or metal cations diffused from the TIV 15 may be oxidized, and an oxide layer 50 may be formed aside the TIV 15. The oxide layer 50 includes a metal oxide such as copper oxide. In some embodiments, as shown in FIG. 3A, the oxide layer 50 is formed on the sidewalls of the TIV 15 and located between the TIV 15 and the adhesion promoter layer 18a. In some embodiments, migration of the oxide layer 50 may be occurred over time. That is, the location of the oxide layer 50 may be changed over time. For example, the oxide layer 50 may migrate away from the sidewalls of the TIV 15 and may be distributed within the adhesion promoter layer 18a, as shown in FIG. 3B. In some embodiments, the oxide layer 50 may further migrate out of the adhesion promoter layer 18a and is located between the adhesion promoter layer 18a and the encapsulant 28a, as shown in FIG. 3C. Although the oxide layer 50 is illustrated as a continuous layer, the disclosure is not limited thereto. In alternative embodiments, the oxide layer 50 may be a discontinuous layer. The oxide layer 50 may have a uniform thickness or includes a plurality of oxide portions with different thicknesses.

In the embodiments of the disclosure, the adhesion promoter layer is formed between the TIV and the encapsulant, and chemical bonds are formed between the TIV and the adhesion promoter layer, so as to improve the adhesion between the TIV and the encapsulant and avoid the delamination or crack between the TIV and the encapsulant. Further, the oxidation of the TIV may be avoided or reduced. Therefore, product yield and the reliability of the package structure are improved.

In accordance with some embodiments of the disclosure, a package structure includes a die, a TIV, an encapsulant, an adhesion promoter layer, a RDL structure and a conductive terminal. The TIV is laterally aside the die. The encapsulant laterally encapsulates the die and the TIV. The adhesion promoter layer is sandwiched between the TIV and the encapsulant. The RDL structure is electrically connected to the die and the TIV. The conductive terminal is electrically connected to the die through the RDL structure.

In accordance with alternative embodiments, a package structure includes a die, a TIV, an adhesion promoter layer, an encapsulant, a first RDL structure, a second RDL structure and a conductive terminal. The TIV is laterally aside the die. The adhesion promoter layer laterally surrounds the TIV. The encapsulant laterally encapsulates the die, the adhesion promoter layer and the TIV. The first RDL structure is located on a back side of the die. The second RDL structure is located on a front side of the die. The conductive terminal is electrically connected to the die through the second RDL structure.

In accordance with some embodiments of the disclosure, a method of forming a package structure includes the following processes. A TIV is formed laterally aside a die. An adhesion promoter layer is formed on sidewalls of the TIV. An encapsulant is formed to laterally encapsulate the die, the adhesion promoter layer and the TIV. A RDL structure is formed on the die and the encapsulant. A conductive terminal is formed to electrically connect to the die RDL structure.

The foregoing outlines features of several embodiments so that those skilled in the art may better understand the aspects of the disclosure. Those skilled in the art should appreciate that they may readily use the disclosure as a basis for designing or modifying other processes and structures for carrying out the same purposes and/or achieving the same advantages of the embodiments introduced herein. Those skilled in the art should also realize that such equivalent constructions do not depart from the spirit and scope of the disclosure, and that they may make various changes, substitutions, and alterations herein without departing from the spirit and scope of the disclosure.

What is claimed is:

1. A package structure, comprising:
   a die;
   an encapsulant, laterally encapsulating the die;
   a polymer layer, under the die and the encapsulant;
   a through via extending through the encapsulant and the polymer layer;
   an adhesion promoter layer, sandwiched between the through via and the encapsulant, wherein upper sidewalls of the through via extending through the encapsulant are covered by the adhesion promoter layer, while lower sidewalls and a bottom surface of the through via are uncovered by the adhesion promoter layer; and
   wherein the encapsulant comprises a portion aside the through via and under the adhesion promoter layer, and the portion of the encapsulant is sandwiched between the adhesion promoter layer and the polymer layer.

2. The package structure of claim 1, wherein the through via comprises a seed layer and a conductive post on the seed layer, and the seed layer is laterally sandwiched between the conductive post and the polymer.

3. The package structure of claim 2, wherein the adhesion promoter layer comprises a first portion covering a sidewall of the seed layer and a second portion covering a sidewall of the conductive post,
   wherein the first portion of the adhesion promoter layer and the seed layer are laterally sandwiched between the conductive post and the encapsulant, and the second portion of the adhesion promoter layer is laterally sandwiched between the conductive post and the encapsulant.

4. The package structure of claim 3, wherein a thickness of the first portion of the adhesion promoter layer is less than a thickness of the second portion of the adhesion promoter layer.

5. The package structure of claim 4, wherein the first portion of the adhesion promoter layer is tapered away from the second portion.

6. The package structure of claim 4, further comprising a redistribution layer under the polymer, and seed layer is electrically connected to the redistribution layer.

7. The package structure of claim 1, wherein the portion of the encapsulant is in physical contact with the adhesion promoter layer and the polymer.

8. The package structure of claim 1, wherein the adhesion promoter layer comprises a top surface coplanar with a top surface of the through via.

9. The package structure of claim 1, wherein the adhesion promoter layer comprises a bottommost surface higher than a bottom surface of the encapsulant and the bottom surface of the through via.

10. A package structure, comprising:
    a first die and a second die;
    a first through via, laterally aside the first die;
    a second through via, laterally aside the second die;
    a first adhesion promoter layer laterally surrounding the first through via;
    a second adhesion promoter layer laterally surrounding the second through via;
    a first encapsulant, laterally encapsulating the first die, the first adhesion promoter layer and the first through via;
    a second encapsulant, laterally encapsulating the second die, the second adhesion promoter layer and the second through via;
    a first redistribution layer (RDL) structure, between the first die and the second die and electrically connected to the first through via, the second through via, and the first die;
    a first polymer layer, under the first through via; and
    a second polymer layer of the first RDL structure, under the second through via, a second RDL structure, on the second die, the second encapsulant, the second through via, and the second adhesion promoter layer, wherein sidewalls of the second through via are in physical contact with the second adhesion promoter layer, and a bottom portion of the second through via is in physical contact with the second polymer layer, wherein the second encapsulant comprises a portion aside the second through via and under the second adhesion promoter layer, and the portion of the second encapsulant is sandwiched between the second adhesion promoter layer and the second polymer layer.

11. The package structure of claim 10, wherein the second adhesion promoter layer is in physical contact with the second encapsulant.

12. The package structure of claim 10, wherein an orthographic projection of the second adhesion promoter layer on a top surface of the first RDL structure is overlapped with an orthographic projection of a portion of the second encapsulant on the top surface of the first RDL structure.

13. The package structure of claim 10, wherein the bottom portion of the second through via is embedded in the second polymer layer of the first RDL structure.

14. The package structure of claim 10, wherein the second adhesion promoter layer comprises a bottom surface in contact with the second encapsulant.

15. A method of forming a package structure, comprising:
forming a first polymer;
attaching a first die on the first polymer;
forming a first through via laterally aside the first die and on the first polymer;
forming a first adhesion promoter layer on sidewalls of the first through via;
forming a first encapsulant, laterally encapsulating the first die, the first adhesion promoter layer and the first through via;
forming a redistribution layer (RDL) structure on the first die, the first through via, the first adhesion promoter layer, and the first encapsulant;
attaching a second die on the RDL structure;
forming a second through via laterally aside the second die; and
forming a second adhesion promoter layer on sidewalls of the second through via;
forming a second encapsulant, laterally encapsulating the second die, the second adhesion promoter layer and the second through via, wherein the second adhesion promoter layer is sandwiched between the second through via and the second encapsulant, wherein the sidewalls of the second through via are covered by the second adhesion promoter layer, while a bottom surface of the second through via is uncovered by the second adhesion promoter layer, wherein the second encapsulant comprises a portion aside the second through via and under the second adhesion promoter layer, and the portion of the second encapsulant is sandwiched between the second adhesion promoter layer and a second polymer layer of the RDL structure.

16. The method of claim 15, wherein the forming the second adhesion promoter layer and the forming the second encapsulant comprise:
performing a treatment process on the second through via to form an adhesion promoter material layer on the sidewalls and a top surface of the second through via;
forming a second encapsulant material layer to second encapsulant sidewalls and a top surface of the second die, and sidewalls and a top surface of the adhesion promoter material layer; and
performing a planarization process to remove a portion of the second encapsulant material layer over the top surface of the second die and the top surface of the second through via, and a portion of the second adhesion promoter layer on the top surface of second through via.

17. The method of claim 16, wherein the treatment process is performed by applying a treatment agent on the second through via and conducting a reaction between the second through via and the treatment agent, a reaction product of the reaction form the adhesion promoter material layer.

18. The method of claim 17, wherein the treatment agent comprises a first functional group and a second functional group, the first functional group reacts with the second through via and the second functional group reacts with the second encapsulant material layer.

19. The method of claim 17, wherein the treatment agent comprises a chelating agent, and the reaction comprises a chelating reaction.

20. The method of claim 17, wherein chemical bonds are formed between the second through via and the adhesion promoter material layer during the reaction.

* * * * *